United States Patent

Küpfer

[15] 3,673,433

[45] June 27, 1972

[54] CIRCUIT ARRANGEMENT FOR SELECTIVELY CONNECTING AT LEAST TWO INPUTS TO A COUNTING STAGE POSSESSING AT LEAST ONE PREPARATORY INPUT AND ONE TRIGGERING INPUT AND INCLUDING CONTACT BOUNCE SUPPRESSION CIRCUITRY

[72] Inventor: Hanspeter Küpfer, Geroldswil, Switzerland

[73] Assignee: Albiswerk Zurich AG, Zurich, Switzerland

[22] Filed: July 26, 1971

[21] Appl. No.: 166,070

[30] Foreign Application Priority Data

Aug. 21, 1970 Switzerland ..........................12523/70

[52] U.S. Cl. ..........................307/247 A, 307/218, 307/243, 328/223

[51] Int. Cl. ....................................H03k 17/28, H03k 17/16

[58] Field of Search ..............307/247 A, 243, 218; 328/113, 328/223

[56] References Cited

UNITED STATES PATENTS 2,723,346 11/1955 Magnuson..........................307/247 A 3,333,111 7/1967 Houle ...............................307/247 A

FOREIGN PATENTS OR APPLICATIONS 1,290,587 3/1969 Germany ..........................307/247 A

*Primary Examiner*—John S. Heyman

*Attorney*—Werner W. Kleeman

[57] ABSTRACT

A circuit arrangement for selectively connecting at least two inputs to a counting stage equipped with at least one preparatory input and one triggering input, wherein these inputs are connected in circuit with the triggering input of the counting stage through the agency of associated gates and a successively arranged common gate. A respective input of each associated gate is connected to a voltage via a respective switch controlling such gate. For the purpose of slowing down or retarding the switching-in signal flank there is connected in series with each switch an inductance coil and a damping resistor which collectively form in conjunction with a respective grounded capacitor an at least approximately critically damped series oscillating circuit. The junction point between each damping resistor and associated capacitor is connected via a diode and a common resistor to an oppositely poled voltage, and the junction point between each such diode and the common resistor is connected with the preparatory input of the counting stage.

2 Claims, 2 Drawing Figures

CIRCUIT ARRANGEMENT FOR SELECTIVELY CONNECTING AT LEAST TWO INPUTS TO A COUNTING STAGE POSSESSING AT LEAST ONE PREPARATORY INPUT AND ONE TRIGGERING INPUT AND INCLUDING CONTACT BOUNCE SUPPRESSION CIRCUITRY

BACKGROUND OF THE INVENTION

The present invention relates to a new and improved circuit arrangement for selectively connecting at least two inputs to a counting stage possessing at least one preparatory input and one triggering input, these inputs being connected through the agency of associated gates and a successively arranged common gate with the triggering input of the counting stage, and further, wherein a respective input of each associated gate is coupled through the intermediary of a switch controlling such gate with a voltage.

Oftentimes the problem arises of selectively switching-through current pulses which have arrived at different lines to a counting circuit. However, when performing this operation the difficulty arises that owing to the switching operation itself undesired signal flanks appear which cause the counting circuit to unintentionally count further. Now if the switching operation takes place by means of a mechanical switch or if such delivers a control voltage for performing the switching operation by electronic switch means, then, owing to switch chatter during each switching operation it is possible, in fact, that even further erroneous pulses are produced.

SUMMARY OF THE INVENTION

Hence, from what has been stated above it will be seen that the prior art is still in need of improved circuit arrangements for carrying out the previously explained functions in a manner avoiding the aforementioned disadvantageous operations. Hence, a primary objective of this invention is to provide just such circuit arrangement which effectively and reliably fulfills the existing need in the art and overcomes the previously explained drawbacks prevailing with prior art circuitry of this character.

Another and more specific object of the present invention relates to a novel circuit arrangement for selectively connecting at least two inputs to a counting stage possessing at least one preparatory input and one triggering input, wherein these inputs are connected with the triggering input of the counting stage through the agency of associated gates and a common gate arranged following these associated gates, and further wherein a respective input of each such associated gate is connected through the intermediary of a switch controlling the gate with a voltage.

According to important aspects of this development, and for the purpose of fulfilling these and still other objects of the invention which will become more readily apparent as the description proceeds, the inventive circuit arrangement is manifested by the features that, for the purpose of slowing down or retarding the switching-in signal flank there is connected in series with each switch a choke or inductance coil and a damping resistor which, together with a grounded capacitor, form an at least approximately critically damped series oscillating circuit. The function or terminal point of each such damping resistor and associated capacitor is connected via a diode and a common resistor to an oppositely poled voltage, and further, the junction point between each of these diodes and the common resistor is connected with the preparatory input of the counting stage.

One of the primary advantages of the novel circuit arrangement of this development resides in the fact that during the switching-in and switching-out of the different inputs no undesired counting pulses appear at the counting stage or circuit. The circuit arrangement of this invention is not limited to a given number of inputs. It is readily possible to subsequently add to the system additional inputs.

BRIEF DESCRIPTION OF THE DRAWING

The invention will be better understood and objects other than those set forth above will become apparent when consideration is given to the following detailed description thereof. Such description makes reference to the annexed drawing, wherein.

DETAILED DESCRIPTION OF THE PREFERRED EMBODIMENTS

Figure 1:
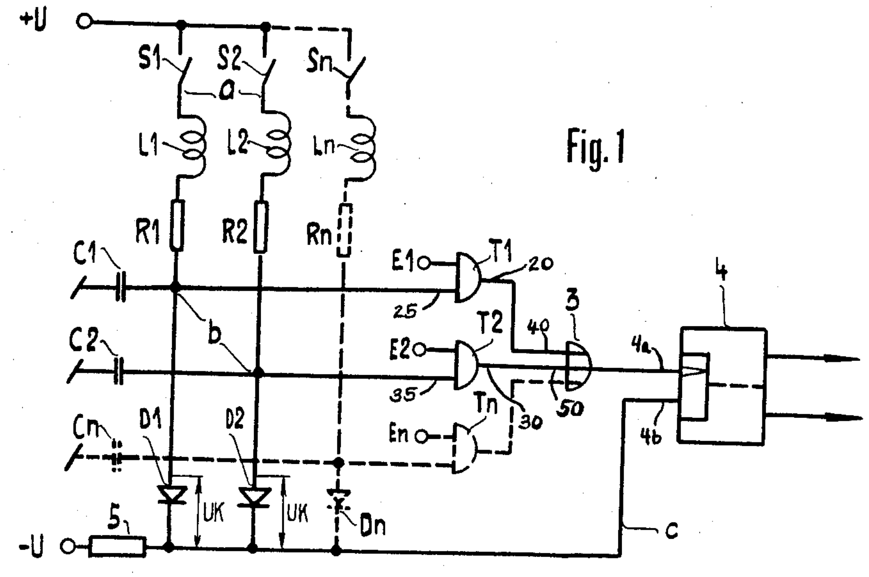
FIG. 1 is a circuit diagram of a preferred embodiment of inventive circuit arrangement for selectively connecting two inputs to a counting stage possessing a triggering input and a preparatory input.

Describing now the drawing, in FIG. 1 there is shown a preferred construction of inventive circuit arrangement containing a counting stage or circuit 4 at which there should be selectively switched-through the pulses appearing at the input E1 or the input E2. In the illustrated embodiment switching-through of such pulses takes place by means of a first a second AND-gate T1 and T2 which, in each case, are opened by a control voltage. The outputs 20 and 30 of the AND-gates T1 and T2 are connected to separate inputs 40 and 50 respectively of an OR-gate 3. The OR-gate 3 delivers the pulses which have been switched-through by the AND-gates T1 and T2 to the triggering input 4*a* of the counting stage 4. This counting stage 4 also has a preparatory input 4*b*, so that the pulses appearing at the triggering input 4*a* are only effective if a voltage also appears at the preparatory input 4*b*.

A respective input or input means 25 and 35 of each AND-gate T1 and T2 is connected through the agency of a respective switch S1 and S2 controlling the respective gates T1 and T2, with a voltage +U. In order to slow-down or delay the switching-in flank, a respective inductance coil or choke L1 and L2 is connected in series with each switch S1 and S2 respectively, and there is also connected in series with each such switch S1 and S2 a damping resistor R1 and R2 respectively, as shown. Now the inductance coil L1 and the damping resistor R1 are connected with a grounded capacitor C1, and also the inductance coil L2 and the damping resistor R2 are likewise connected with a grounded capacitor C2, so as to form the respective critically damped series oscillating circuits. The junction point of each resistor R1 and R2 and its associated capacitor C1 and C2 respectively, is connected via a respective diode D1 and D2 and a common resistor to an oppositely poled voltage −U. The respective junction point between these diodes D1 and D2 and the common resistor 5 is electrically connected with the preparatory input 4*b* of the counting stage 4.

Figure 2:
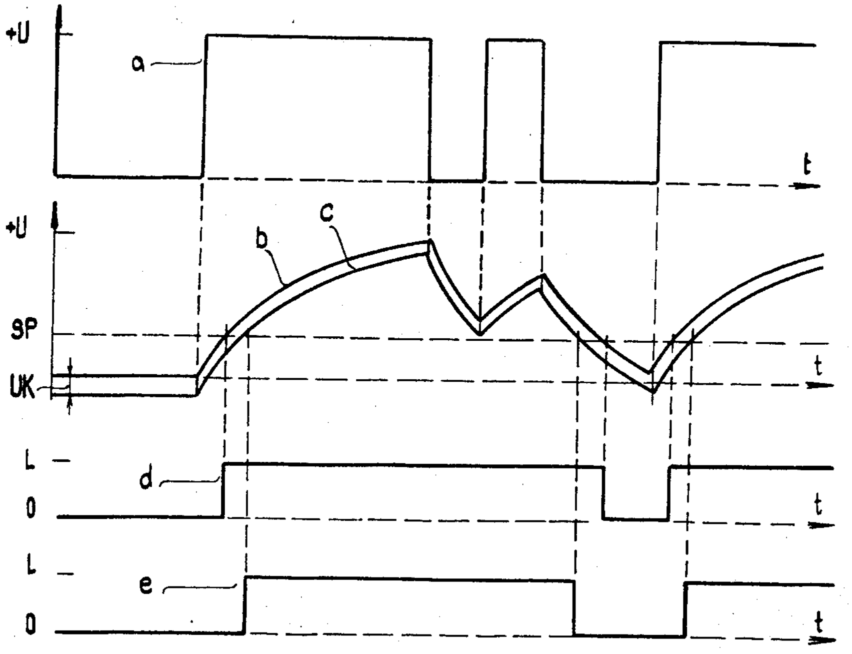
FIG. 2 illustrates graphs of the voltage curves or envelopes appearing at different points throughout the circuit arrangement of FIG. 1.

Now, in FIG. 2 reference character *a* indicates the moment of time of switching-in the control voltage which is switched-through by one of the switches S1 or S2. Owing to the chatter of the switch S1 or S2 the voltage is switched-in and again switched-out a number of times as is well known in this particular art.

Now the curve *b* shows the control voltage during the switching-in operation at the input 25 or 35 of an AND-gate T1 or T2 respectively. The curve *c* shows the envelope or course of the voltage at the preparatory input 4*b* of the counting stage or circuit 4.

As can be readily seen by referring to FIG. 2, the voltage at the preparatory input 4*b* is always more negative, by the amount of the voltage drop across the respective diodes D1 and D2, than the voltage which appears via the AND-gate T1 or T2 and the OR-gate 3 at the triggering input 4*a*. The counting stage 4 and the gates T1, T2, T3 exhibit at the inputs the same switching threshold SP for the input voltage. In order to render the input voltages effective, such must exceed the switching threshold SP. Both of the curves *d* and *e* indicate the logical significance of both input voltages of the counting circuit, wherein upon exceeding the switching threshold SP the condition L is obtained.

Having now had the benefit of the foregoing description of the preferred embodiment of inventive circuit arrangement its mode of operation will be now considered and is as follows:

If the switch S1 or S2 is open then from the input or input means 25 or 35 of the AND-gate T1 or T2 and via the relevant diode D1 or D2 and the resistor 5 a current flows to the terminal −U. Consequently, a voltage drop UK appears at the diode D1 or D2 corresponding to its bottoming or knee voltage. The voltage which is delivered to the preparatory input 4b of the counter stage 4 is therefore more negative by the amount of this voltage drop UK than the voltage at the input of the AND-gate T1 or T2.

On the assumption that pulses which arrive at the input E1 should be conducted to the counting stage 4 the switch S1 is closed. The voltage +U which is switched-through by the switch S1 changes, via the inductance coil L1 and the damping resistor R1, the capacitor C1. During a number of times that this switch is switched-in and switched-out owing to switch chatter the capacitor C1 completely or partially charges and discharges. The voltage appearing at the capacitor 1 is effective at the triggering input 4*a* of the counting stage 4 through the agency of the AND-gate T1 and the OR-gate 3. Also, if the switch S1 is closed a current flows via the diode D1 and the resistor 5 to the terminal −U, whereby a voltage drop UK appears across the diode D1 corresponding to its knee or bottoming voltage. The voltage delivered to the preparatory input 4*b* is therefore always more negative by the amount of this voltage drop UK than the voltage which is effective at the triggering input 4*a*. As can be seen by referring to FIG. 2 along the ascending signal flank or portion of the curves *b*, *c* the switching threshold voltage SP at the preparatory input 4*b*, required for flipping or switching the counting stage 4, is always reached somewhat later in time than at the triggering input 4*a*. However, along the descending portion of the curves *b*, *c* the reverse situation prevails. Owing to this forced sequence, both the switching-in as well as also the switching-out flank of the control voltage or signal is without effect at the counting stage 4, since at the relevant point of time the voltage at the preparatory input 4*b* is always below the switching threshold SP. As soon as the control voltage at the AND-gate T1 and at the preparatory input of the counting stage 4 become effective the pulses from the input E1 are switched-through via the OR-gate 3 to the triggering input 4*a* of the counting stage 4 and cause such to perform a counting operation. In order to switch over the inputs the switch S1 is opened and the switch S2 is closed. The switching-through of the pulses from the input E2 to the counting stage 4 then takes place in analogous manner.

The diode-resistor combination D1, D2, 5 fulfills a double function. On the one hand, such carries out an OR-function for generating a common preparatory voltage from the control voltages delivered by both switches S1 and S2. On the other hand, it has the characteristic that it delivers a preparatory voltage which is shifted or displaced with respect to the delivered control voltages by the amount of the knee voltage of the diodes.

As already indicated heretofore, the circuit arrangement can of course be amplified so as to be employed with additional inputs. If such be the case, then, for each further input E*n*, there would be provided the additional circuit components conveniently shown in phantom lines in FIG. 1, namely the capacitor C*n*, diode D*n*, damping resistor R*n*, inductance coil L*n* and switch S*n*.

While there is shown and described present preferred embodiments of the invention, it is to be distinctly understood that the invention is not limited thereto but may be otherwise variously embodied and practiced within the scope of the following claims.

Accordingly, what is claimed is:

1. A circuit arrangement for selectively connecting at least two inputs to a counting stage equipped with at least one preparatory input and one triggering input, comprising a respective gate in electrical circuit association with each input, a common gate in circuit with and following said gates associated with the inputs, said inputs being connected via said associated gates and said common gate with said triggering input of the counting stage, each said associated gate having an input means, each input means of each associated gate being connected to a first voltage via a respective switch controlling such associated gate, an inductance coil and a damping resistor connected in series with each said switch for retarding the switching-in flank, a respective grounded capacitor in circuit with each series connected inductance coil and damping resistor and forming together with such an at least approximately critically damped series oscillating circuit, a common resistor for said series oscillating circuits, a respective diode for connecting the junction point of each damping resistor and associated capacitor with an oppositely poled voltage via said common resistor, and means for connecting the junction point between each diode and said common resistor with the preparatory input of the counting stage.

2. A circuit arrangement for selectively connecting at least two inputs to a counting stage equipped with at least one preparatory input and one triggering input, comprising a respective gate in electrical circuit association with each input, each gate having an output, a common gate electrically coupled with the outputs of said gates associated with the inputs, said inputs being connected via said associated gates and said common gate with said triggering input of the counting stage, a first voltage, each said associated gate having an input means, a respective switch controlling each of said associated gates, each input means of each associated gate being connected via its switch with said first voltage, an inductance coil and a damping resistor connected in series with each switch for retarding the switching-in signal flank, a grounded capacitor provided for each series connected inductance coil and damping resistor, each said grounded capacitor and series connected inductance coil and damping resistor collectively forming an at least approximately critically damped series oscillating circuit, a common resistor for all of said series oscillating circuits, a second voltage oppositely poled with respect to said first voltage, a respective diode for connecting the junction point of each damping resistor and its associated capacitor with said oppositely poled second voltage via said common resistor, and means for connecting the junction point between each said diode and said common resistor with the preparatory input of the counting stage.

* * * * *